(12) United States Patent
Chow (10) Patent No.: US 6,646,904 B2
(45) Date of Patent: Nov. 11, 2003

(54) FERROELECTRIC MEMORY AND METHOD OF READING THE SAME

(75) Inventor: David GenLong Chow, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/028,519

(22) Filed: Dec. 21, 2001

(65) Prior Publication Data

US 2003/0117830 A1 Jun. 26, 2003

(51) Int. Cl.[7] .............................................. G11C 11/22
(52) U.S. Cl. ...................... 365/145; 365/117; 365/203; 365/204
(58) Field of Search ........................ 365/145, 117, 365/189.02, 204, 206, 203

(56) References Cited

U.S. PATENT DOCUMENTS 5,835,400 A * 11/1998 Jeon et al. .................. 365/145

2002/0024835 A1 * 2/2002 Thompson et al. .......... 365/117
2002/0060923 A1 * 5/2002 Thompson et al. .......... 365/145
2003/0021143 A1 * 1/2003 Nair ........................... 365/145

* cited by examiner

Primary Examiner—Richard Elms
Assistant Examiner—Toan Le
(74) Attorney, Agent, or Firm—Marger Johnson & McCollom PC (57) ABSTRACT

A ferroelectric memory includes wordlines that cross over bitlines with a ferroelectric cell at each crossing. When reading a select cell of the array, sneak currents are drawn from an active bitline. An integration amplifier begins integrating charge propagated by the active bitline, and an active wordline receives a read level voltage. A first integration value is then obtained from the integration amplifier. Following the first integration, the integration amplifier is cleared and the voltage of the active wordline reduced to a quiescent level. Integration and wordline activation are again performed to obtain a second integration value. The second value is subtracted from the first, and the difference compared to a threshold to determine a data value.

17 Claims, 13 Drawing Sheets

FERROELECTRIC MEMORY AND METHOD OF READING THE SAME

BACKGROUND

The present invention relates generally to electronic memory and, more particularly, to a method of reading a ferroelectric cell of a ferroelectric memory array.

Exemplary known semiconductor memory include dynamic random access memory (DRAM), static random access memory (SRAM), electrically programmable read only memory (EPROM), flash memory, and ferromagnetic semiconductor memory devices. SRAM and DRAM devices are volatile, and require continuous power for data retention. When power is removed from these volatile devices, data is lost.

Unlike the volatile devices, nonvolatile memory can provide data retention in the absence of power. Exemplary known nonvolatile memory include the magneto-resistive, ferro-magnetic, and ferroelectric memory devices. Recently, manufacturers of nonvolatile memory have been working to improve ferroelectric memory.

Figure 1:
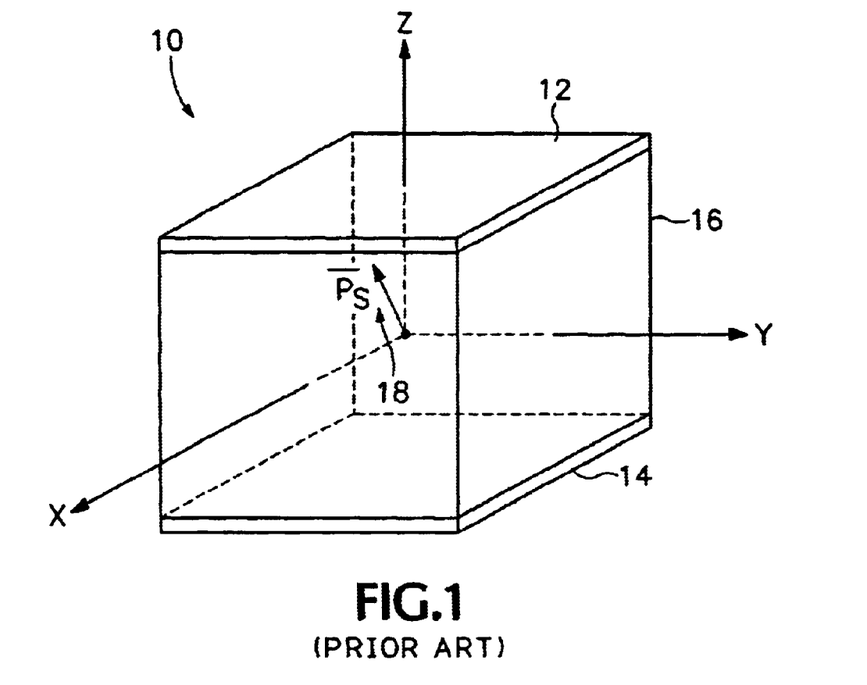
FIG. 1 provides an isometric view of an exemplary known ferroelectric cell.
Figure 2:
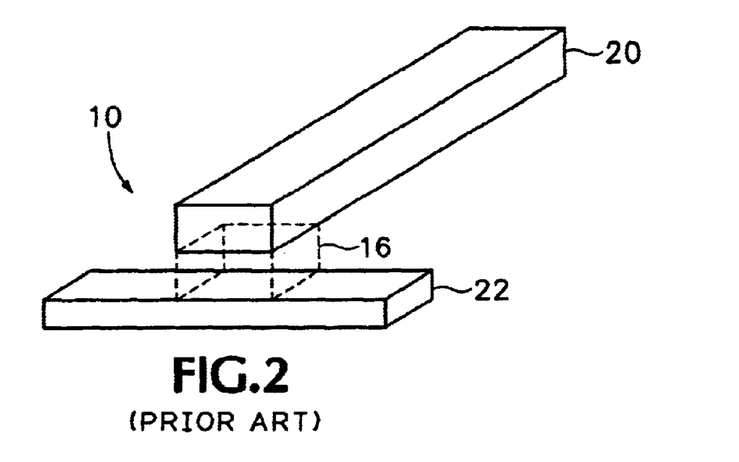
FIG. 2 provides a partial cross-sectional and isometric view of a known ferroelectric cell between a wordline and bitline.

Referencing FIGS. 1 and 2, an exemplary known ferroelectric cell 10 comprises ferroelectric material 16 sandwiched between first and second electrodes 12,14, such as, for example, wordline 20 and bitline 22 of a known ferroelectric memory array. The spontaneous polarization $P_s$ vector characterizes an alignment of domains of the ferroelectric material as influenced by an electric field. Upon removal of the electric field, a remanent polarization $P_r$ remains. Applying a switching level electric field of opposite polarity reverses the polarization orientation.

Figure 3:
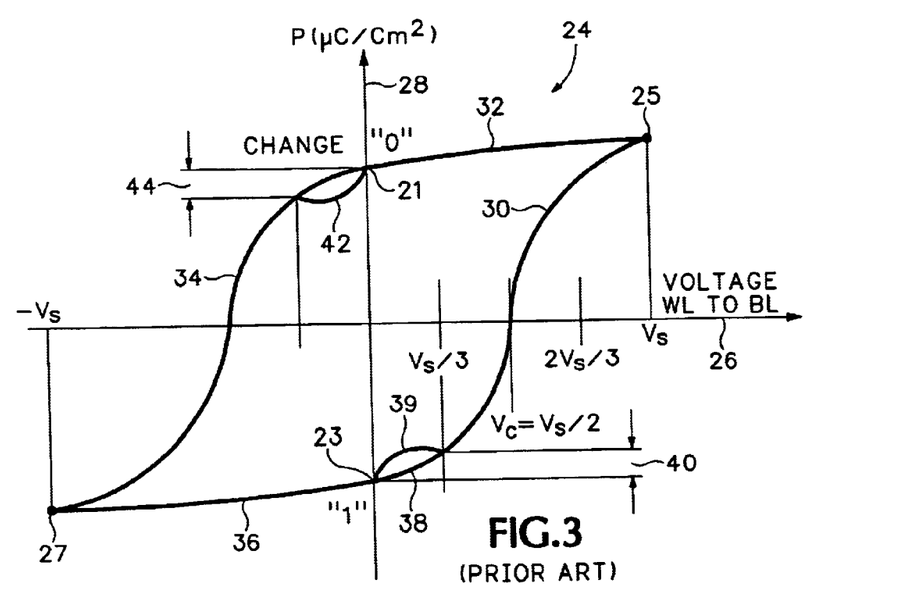
FIG. 3 is a graph depicting a simplified polarization versus voltage hysteresis curve characteristic of a ferroelectric cell.

The polarization versus voltage properties of an exemplary ferroelectric cell are characterized by hysteresis curve 24 of FIG. 3. The hysteresis curve crosses vertical axis 28 at two locations 21,23 representative of the remanent polarizations associated with the "0" (zero) and "1" (one) state storage conditions. For an ideal curve, the remanent polarization $P_r$ under zero bias at position 21 would have a magnitude equal to that of the saturation polarization $P_s$ at bias position 25. However, it is understood that some domains of the ferroelectric do not remain aligned when the applied voltage bias is reduced, e.g., from the saturation level $V_s$ to zero. Accordingly, the magnitude of the remanent polarization $P_r$ is less than that of its saturation polarization $P_s$.

Further referencing FIGS. 2–3, by applying a negative voltage $-V_s$ to wordline 20 relative to bitline 22, the cell's polarization is set to its negative orientation (following path 34 of curve 24 to position 27) for storing a "one" state condition. Upon removing the applied voltage, the cell's negative polarization remains (path 36 to remanent position 23). Thereafter, applying a positive voltage $V_s$ reverses the cell's polarization state, which "one" to "zero" polarization reversal is accompanied by an associated charge release. In contrast, a cell of a zero state would not provide such charge release with application of positive $V_s$. This difference in the released charge between the "one" and "zero" states provides the fundamental principle to read a ferroelectric cell.

Ferroelectrics also exhibit resilience, wherein a ferroelectric cell can restore a remanent polarization despite a small disturbance. For example, assuming a one state storage condition for a ferroelectric cell, as represented by remanent polarization position 23 of hysteresis curve 24, a small voltage disturbance of $V_s/3$ provides a small polarization shift 40 along path 38. However, once the voltage is removed, domains of the ferroelectric cell realign their orientations to that of the cell's overall orientation, as illustrated by return path 39 of hysteresis curve 24.

BRIEF DESCRIPTION OF THE DRAWINGS

The invention may be best understood by reading the disclosure with reference to the accompanying drawings, wherein.

DETAILED DESCRIPTION

Figure 4:
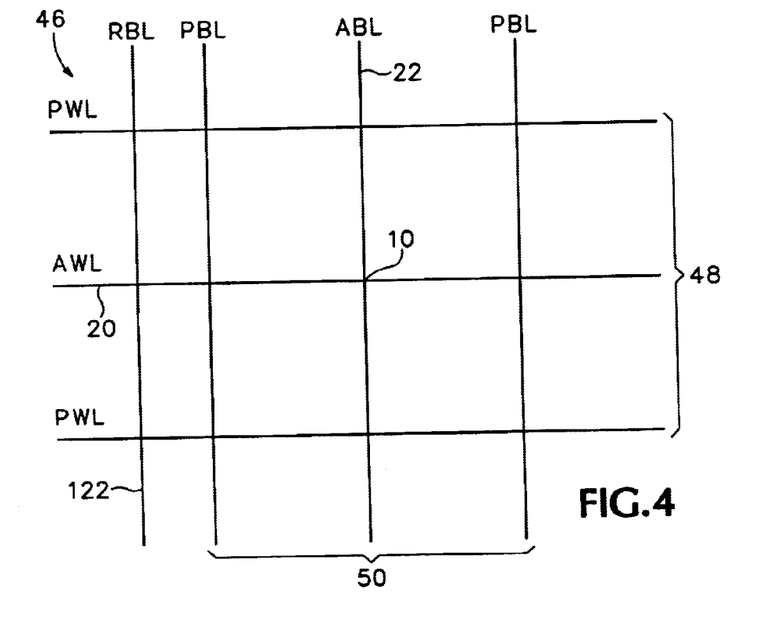
FIG. 4 is a planar schematic view simplistically illustrating a portion of an array of ferroelectric memory cells, as associated with an exemplary embodiment of the present invention.

With reference to FIG. 4, a simplistically illustrated ferroelectric memory array 46, for an exemplary embodiment of the present invention, comprises a plurality of wordlines 48 that overlap a plurality of bitlines 50. Ferroelectric material is sandwiched between the wordlines and bitlines to form ferroelectric cells there between. For example, active ferroelectric cell 10 is located at the crossing of active wordline 20 and active bitline 22. The term "active" depicts the select cell to be read, and distinguishes the particular wordline (AWL) and bitline (ABL) coupled to the active ferroelectric cell. Non-active wordlines and bitlines will be referenced as passive wordlines (PWL) and passive bitlines (PBL) respectively.

When reading an active cell, a read level voltage is applied to the active wordline 20. The read level voltage comprises a magnitude that is defined relative to the active bitline 22, and sufficient to effect a polarization reversal of the active cell 10. Thus, the active cell is destructively read, wherein application of the read level voltage may switch the cell's polarization state. To restore the stored data after a polarization reversal, the data is written back into the active cell in a known fashion. During the read, the passive bitlines and passive wordlines received voltages that assure quiescent level electric fields across the passive ferroelectric cells.

For purposes of describing the present invention, quiescent level voltages are defined in accordance with the resilient qualities of the ferroelectric cell, wherein polarization disturbances of the cells are kept within a recovery range. For example, in accordance with one exemplary embodiment of the present invention, the quiescent level is set to a magnitude less than ⅓ their saturation level voltages ($V_s$).

Figure 5:
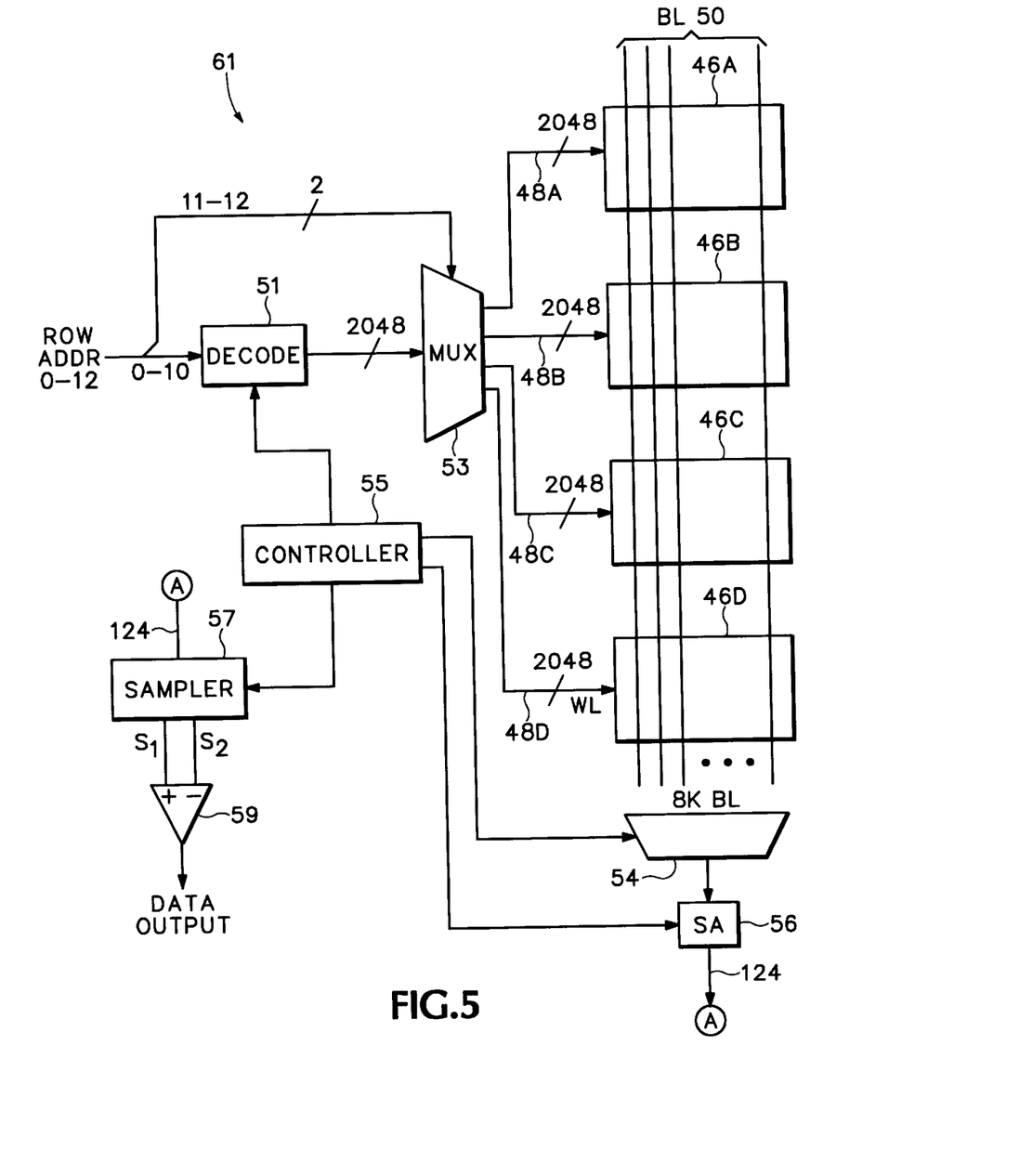
FIG. 5 is a simplified schematic diagram of a ferroelectric memory device, as associated with an exemplary embodiment of the present invention.

With reference to FIG. 5, ferroelectric memory device 61 comprises a plurality of ferroelectric sub-arrays 46A, 46B, 46C, 46D. Bitlines 50 extended through the plurality of subarrays, while wordlines 48A, 48B, 48C, 48D extend laterally across respective subarrays 46A, 46B, 46C, 46D. Row address decoder 51 and multiplexer/driver 53 select which of the plurality of wordlines to drive as an active wordline and which to drive as passive wordlines. Controller 55 controls the sequence of events to establish signals by which to drive the active and passive wordlines. Column multiplexer/driver 54 selects, in accordance with a column address decoder (not shown), which of the bitlines to route, as an active bitline, to integration sense amplifier 56. Non-select bitlines receive quiescent level voltage biasing from multiplexer/driver 54. As with the row circuits, column multiplexer/driver 54 is enabled and sequenced by controller 55 so as to drive the active and passive bitlines with their appropriate signals to read an active cell in accordance with exemplary embodiments of the present invention, as disclosed more fully subsequently hereinafter.

Sense amplifier 56 receives the output of column multiplexer/driver 54, and integrates, under the control of controller 55, a signal of the select active bitline during a sequence of reading a ferroelectric cell. Sampler 57 receives the output of sense amplifier 56, and is operable, under control of controller 55, to sample the signal of the sense amplifier's output 124 to obtain first and second integration values $S_1$, $S_2$. The second integrated value is subtracted from the first. The result is compared to a threshold value to determine a data value of "1" or "0."

Exemplary methods of reading a ferroelectric memory cell are now described relative to the simplified schematic of FIG. 4. However, the descriptions are understood to accompany larger architectures, including associated decode and multiplexer/driver circuits, for example, such as those portrayed by the exemplary embodiment illustrated in FIG. 5.

Figure 6:
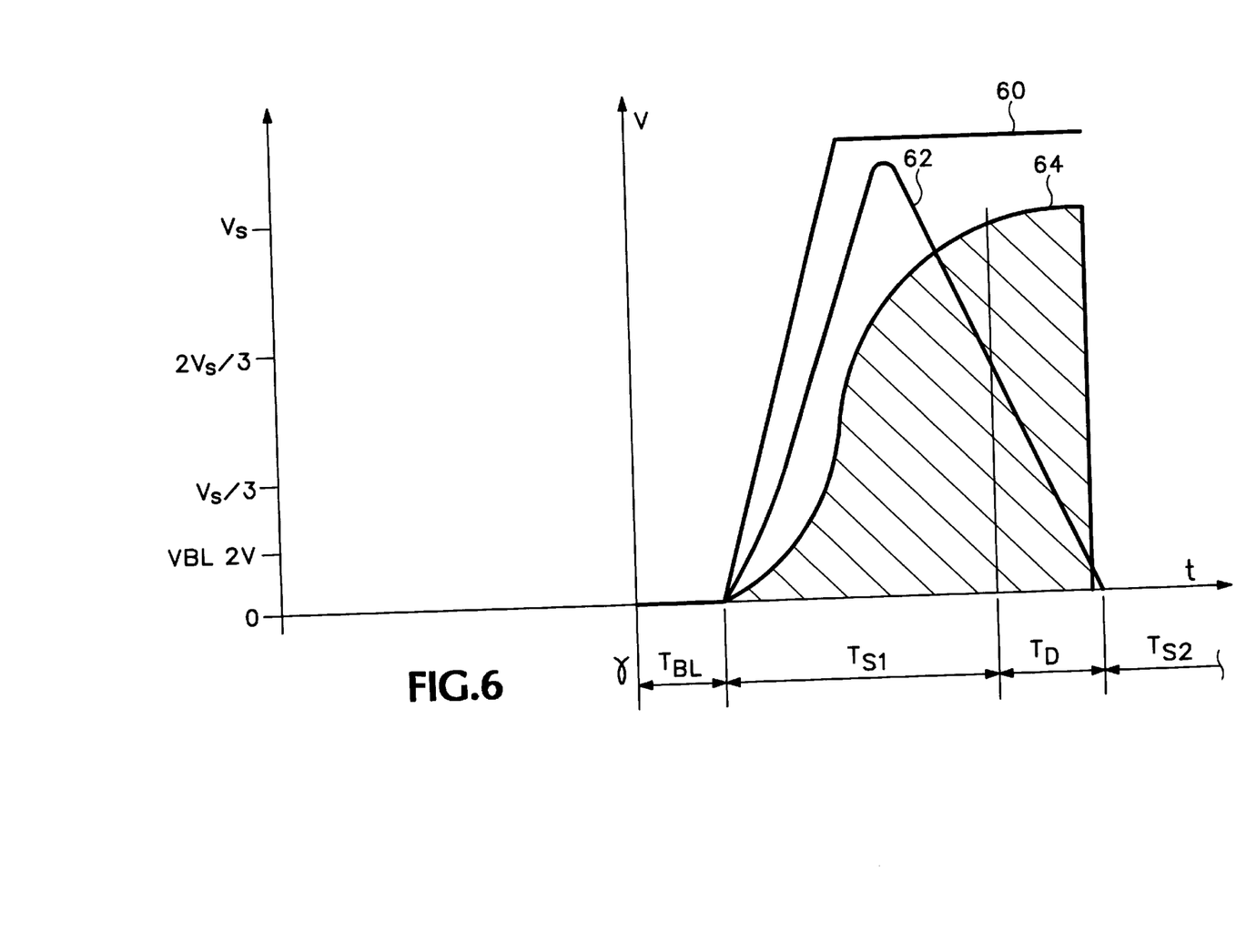
FIG. 6 is a graph schematically illustrating fundamental features of reading a ferroelectric cell, including a wordline activation, charge release from a ferroelectric cell, and integrated accumulation of released charge, for developing an understanding of the present invention.

FIG. 6 simplistically and idealistically characterizes reading of a ferroelectric cell of a one state storage condition, wherein charge is released and integrated during application of a read level voltage. As used herein, the term "read" level voltage characterizes a voltage potential of magnitude sufficient to switch, e.g., a one-state polarization of the ferroelectric cell to a zero-state. More specifically, after duration $T_{BL}$ (e.g., bit line settling as will be described more fully subsequently herein), bias 60 of the active wordline transitions to a switching level $V_s$. Through duration $T_{S1}$, following the wordline activation, the active cell (e.g., cell 10 of FIG. 4) releases charge as depicted by current signal 62 in FIG. 6. By integrating the current, integration voltage signal 64 results. Absent released charge, the integrated result is zero.

Returning to FIG. 4, active bitline 22 is connected, not only to active cell 10, but also to other passive cells associated with passive wordlines PWL. Active wordline 20 is also coupled to other passive cells that are associated with passive bitlines PBL. The present invention is directed to reading of a select ferroelectric cell without corrupting the stored contents of these surrounding, passive ferroelectric cells.

Figure 9:
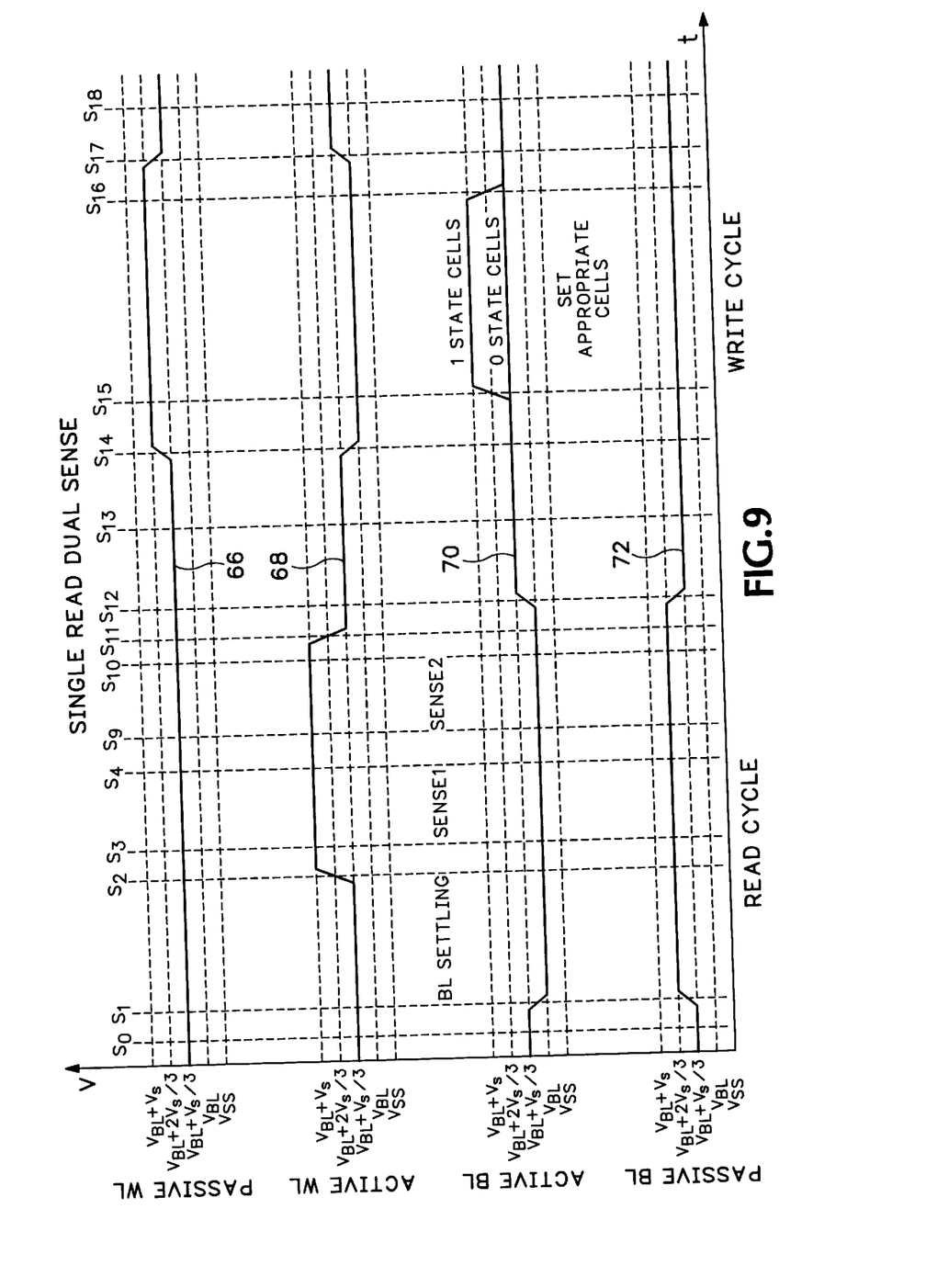
FIG. 9 is a timing diagram schematically illustrating a known sequence of signals associated with reading a ferroelectric cell of a ferroelectric memory array.
Figure 10:
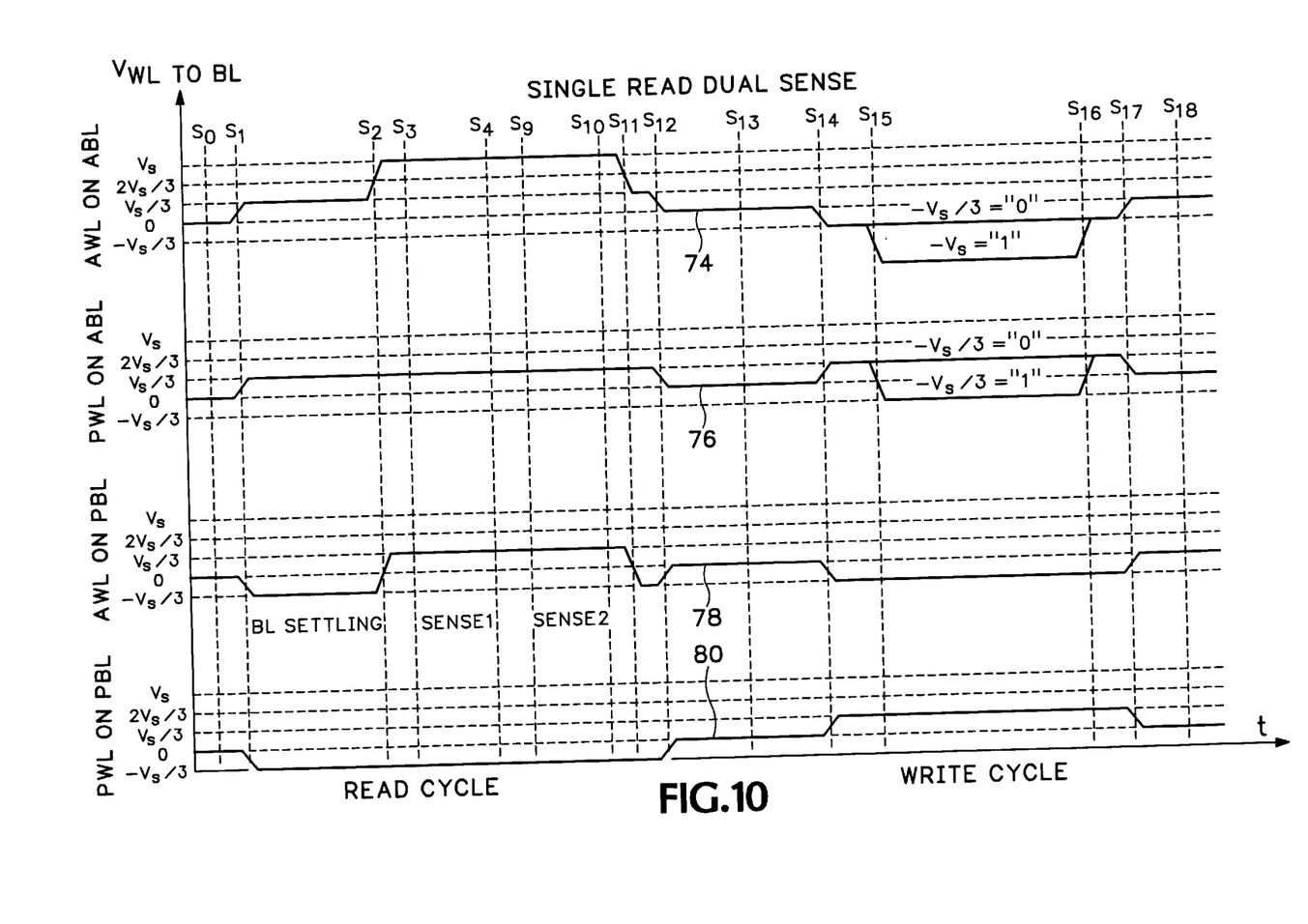
FIG. 10 is a timing diagram schematically illustrating applied voltages to ferroelectric cells of a memory array during the known read sequence of FIG. 9.

Referencing FIGS. 4, 9–10, one known exemplary method of reading a ferroelectric cell within a ferroelectric memory array is identified as a "single read dual sense" technique. When reading a ferroelectric cell 10, the wordlines and bitlines all begin with substantially the same voltage levels, e.g., $V_s/3$ at snapshot time $S_0$. With the wordlines and bitlines at similar bias levels, each ferroelectric cell experiences a voltage influence of about 0 volts, as represented by FIG. 10. Under this steady state condition, each ferroelectric memory cell retains its polarization or storage state condition.

In accordance with a particular, exemplary embodiment of the present invention, the ferroelectric cell comprises ferroelectric material of a given thickness and saturation level voltage $V_s$. For example, assume the cell comprises a ferroelectric polymer of 150 nanometer thickness and saturation level voltage $V_s$ of 18 volts. Although a specific example for the ferroelectric cell is described, it is understood that the scope of the present invention encompasses other ferroelectric materials, thicknesses and saturation levels.

With reference to the timing diagrams of FIGS. 9 and 10, wordline and bitline signals 66, 68, 70, 72, respectively, may be offset with a common DC voltage level, for example, such as a bitline offset voltage $V_{BL}$. For purposes of simplifying the disclosure that follows, the wordline and bitline bias levels are described assuming a bitline offset bias $V_{BL}$ of 0 volts; however, it will be understood that the present invention encompasses various $V_{BL}$ offset levels.

Continuing with the known "single read dual sense" method of reading a ferroelectric memory cell, further referencing FIGS. 9 and 10, the first step of the read cycle comprises lowering the voltage level of the active bitline to 0 volts and increasing the voltage level of the passive bitline to $2V_s/3$, as depicted at snapshot time $S_1$ in FIG. 9. At these levels, the ferroelectric cells between the wordlines and active bitline experience a voltage potential of $V_s/3$, while the ferroelectric cells between the wordlines and the passive bitlines experience a voltage potential of $-V_s/3$ as depicted by waveforms 78, 80 at snapshot time $S_1$ in FIG. 10. Accordingly, during this first stage of the read cycle, cells of 0 state conditions between the wordlines and passive bitlines will experience slight polarization shifts 44 as depicted by hysteresis curve 24 in FIG. 3. On the other hand, cells of one state condition that are associated with the active bitline experience a polarization shift 40 (via path 38 of hysteresis curve 24).

Further referencing FIGS. 9–10, cells coupled to the active bitline experience a voltage potential of $V_s/3$, as depicted by waveforms 74, 76 between times $S_1$ and $S_2$. Passive cells release a residual amount of charge called the "sneak current" to the active bitline. In accordance with a particular exemplary embodiment of the present invention, a residual charge release in the femtocoulombs is expected for propagation to the active bitline. Assuming, for example, that 2048 ferroelectric cells are tied to the active bitline, then the combined "charge" propagated to the active bitline would be large. Therefore, the known "single read dual sense" method begins with the bitline settling duration $T_{BL}$ between times $S_1$ and $S_2$, in order to draw residual charge release from the ferroelectric cells of the active bitline and to stabilize the sneak current before trying to determine the state of an active cell.

Continuing the sequence of the known "single read dual sense" method of FIG. 9, after the bitline settling duration $T_{BL}$, the active wordline is charged to a read level voltage as depicted by waveform 68 at snapshot $S_2$, wherein active ferroelectric cell 10 (see FIG. 4) receives the voltage potential, e.g. saturation level $V_s$, sufficient to switch its polarization storage state, assuming a previous one state storage condition therein, which in turn provides a charge release to the active bitline. Alternatively, for a cell of a zero state condition, only a nominal amount of charge would propagate to the active bitline.

An ideal hysteresis curve (e.g., 24 of FIG. 4) would exhibit a flat slope for path 32 between the remanent polarization position 21 and the saturation position 25. But in reality, the remanent polarization magnitude is less than that of the saturation polarization. Accordingly, a finite polarization change is effected as the level of the applied voltage changes from $V_s/3$ to $V_s$ (path 32 of curve 24 of FIG. 7) and a residual amount of charge propagates to the active bitline to provide a zero state storage condition when the active wordline transitions from $V_s/3$ to $V_s$. Nonetheless, the charge released from a cell of a zero state condition is less than the amount of charge it would release for a one state condition.

A stray capacitance between the active wordline and the active bitline will also contribute charge to the active bitline in response to the transition of the active wordline voltage from the quiescent level to the switching level. In accordance with the known "single read dual sense" method of reading, shown relative to FIG. 9, integration does not begin until after a short interval subsequent to "activation" of the active wordline in order to avoid capture of the residual charge associated with the stray capacitance coupling to the wordline transition. After the short delay, integration begins to integrate charge propagated by the active bitline between times $S_3$ to $S_4$ Next, a first integration value is obtained.

At snapshot time $S_9$, a second integration time window of duration equal to the first provides a second integrated value which is subtracted from the first integrated value. The initial stored state of the active cell is then determined based upon a comparison of the difference to a threshold value. Residual sneak charge is removed from the signal by the subtraction.

After completion of the second integration, the voltage level of active wordline 68 is returned to the quiescent level voltage $V_s/3$, as depicted by waveform 68 at snapshot time $S_{11}$ in FIG. 9, and then the passive and active bitlines, likewise, are returned to their quiescent level voltages of $V_s/3$, as shown by waveforms 70, 72 at snapshot time $S_{12}$. Having read the cell, destructively, a write cycle is typically performed to restore, when necessary, a one state condition to the ferroelectric cell, as depicted by the remainder of the timing diagram of FIG. 9. The write restore cycle does not have to be contiguous to the read. The memory system can track which addresses have been read for enabling subsequent restores.

The "single read dual sense" method of reading a ferroelectric memory cell suffers a couple of exemplary disadvantages. First, when delaying the first integration time window relative to activation of the active wordline so as to avoid residual sneak currents and the residual charge of the stray capacitance, a certain amount of charge that is released from the active cell during the early stages of the wordline activation is not captured by the delayed integration. Additionally, a finite charge that is released from the passive ferroelectric cells of the zero state conditions can affect the reliably of distinguishing a one state condition of the active cell from the zero state condition. Compounding this problem is a property of ferroelectric fatigue.

Figure 7:
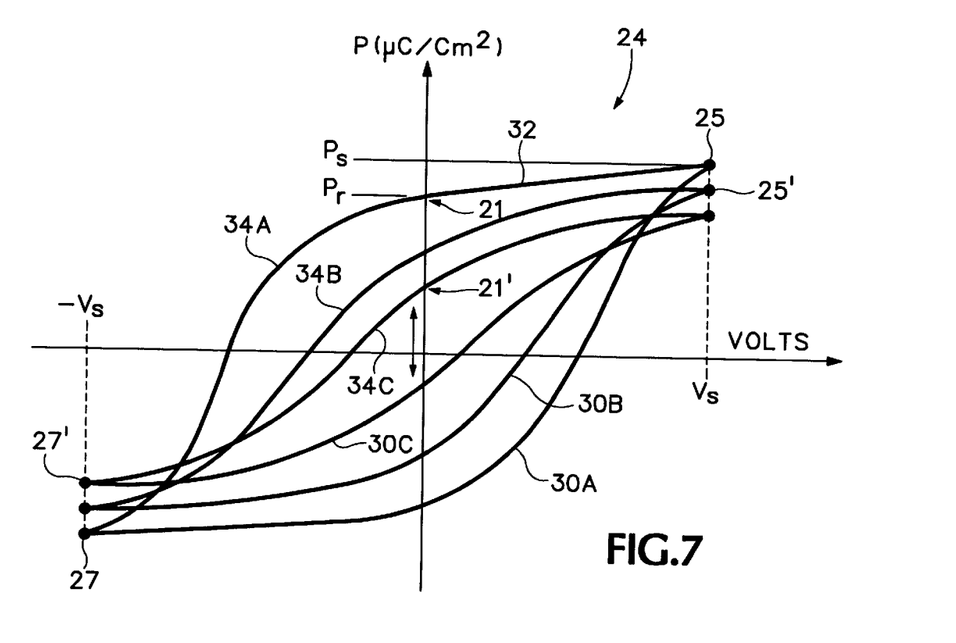
FIG. 7 is a graph of the polarization versus voltage hysteresis curve for an exemplary ferroelectric memory cell, schematically illustrating ferroelectric fatigue properties.

As a ferroelectric cell fatigues, its polarization versus voltage hysteresis curve 24 narrows, as illustrated in FIG. 7. During its later life, the cell's remanent polarization magnitude 21 diminishes relative to its earlier remanent polarization magnitude. Additionally, the saturation polarization Ps also decreases. Accordingly, the relative ratio between released charge of a one state condition and that of a zero state condition decreases in the later life of the ferroelectric cell.

Figure 11:
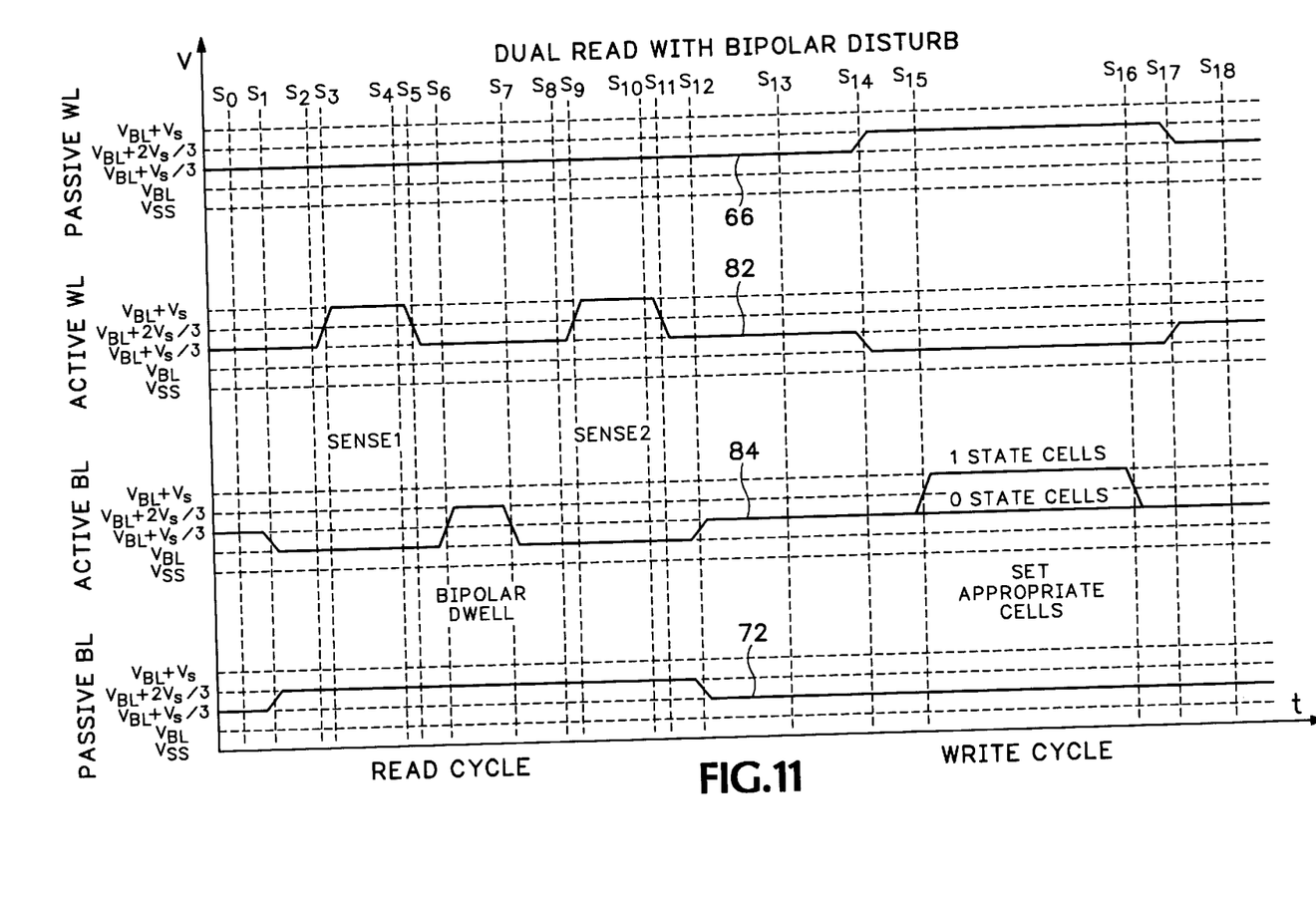
FIG. 11 is a timing diagram schematically illustrating another known sequence of signals associated with reading a ferroelectric cell.
Figure 12:
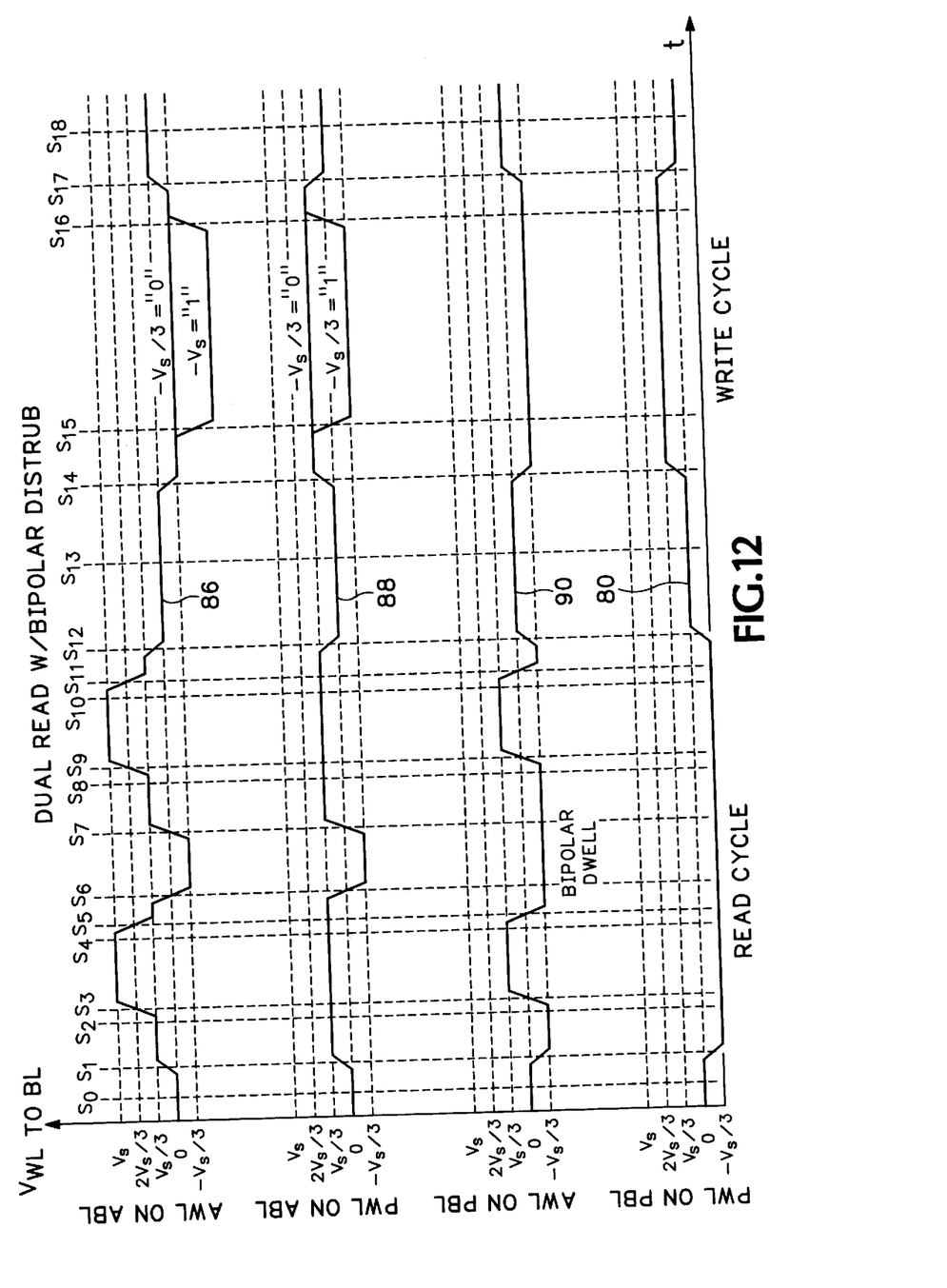
FIG. 12 is a timing diagram schematically illustrating voltages applied to ferroelectric cells of a memory array during the known read sequence of FIG. 11.

Moving forward with reference to FIGS. 11 and 12, a second exemplary known method of reading a ferroelectric memory cell is identified as "dual read with bipolar disturb". For this technique, the active wordline receives two separated active level pulses—i.e., from quiescent level $V_s/3$ to saturation level $V_s$ as shown by waveform 82 of FIG. 11—with a separation between the pulses allowing for an intermediate dwell time. The duration for bitline settling is reduced between sense-1 and sense-2; while a second one is introduced before the second activation of the active wordline, i.e., as represented between time $S_8$ relative to $S_7$. Ideally, the magnitude of sneak current preceding the first integration time window will equal that of the sneak current preceding the second integration time window. In an effort to achieve this aim, the "dual read with bipolar disturb" method provides the active bitline a "bipolar dwell" between times $S_6$ and $S_7$. The bipolar dwell temporarily charges the active bitline to $2V_s/3$ with the intent of restoring remanent polarizations of the memory cells associated with the active bitline. Following the "bipolar dwell" and a second bitline settling duration, the second wordline activation and integration proceed.

As recognized herein, the savings in time provided by the bitline settling reduction is compromised by having to introduce the "bipolar dwell". Additionally, variations in sneak current characteristics, e.g., the sneak current preceding the second integration time window relative to that preceding the first integration time window, adversely affect the reliability of resolving a one state condition relative to the zero state condition.

Recognizing at least some of the limitations of the known methods of reading a ferroelectric cell of a ferroelectric memory array, embodiments of the present invention provide new methods of reading a ferroelectric cell, as are further described below relative to FIGS. 13 and 14.

Figure 13:
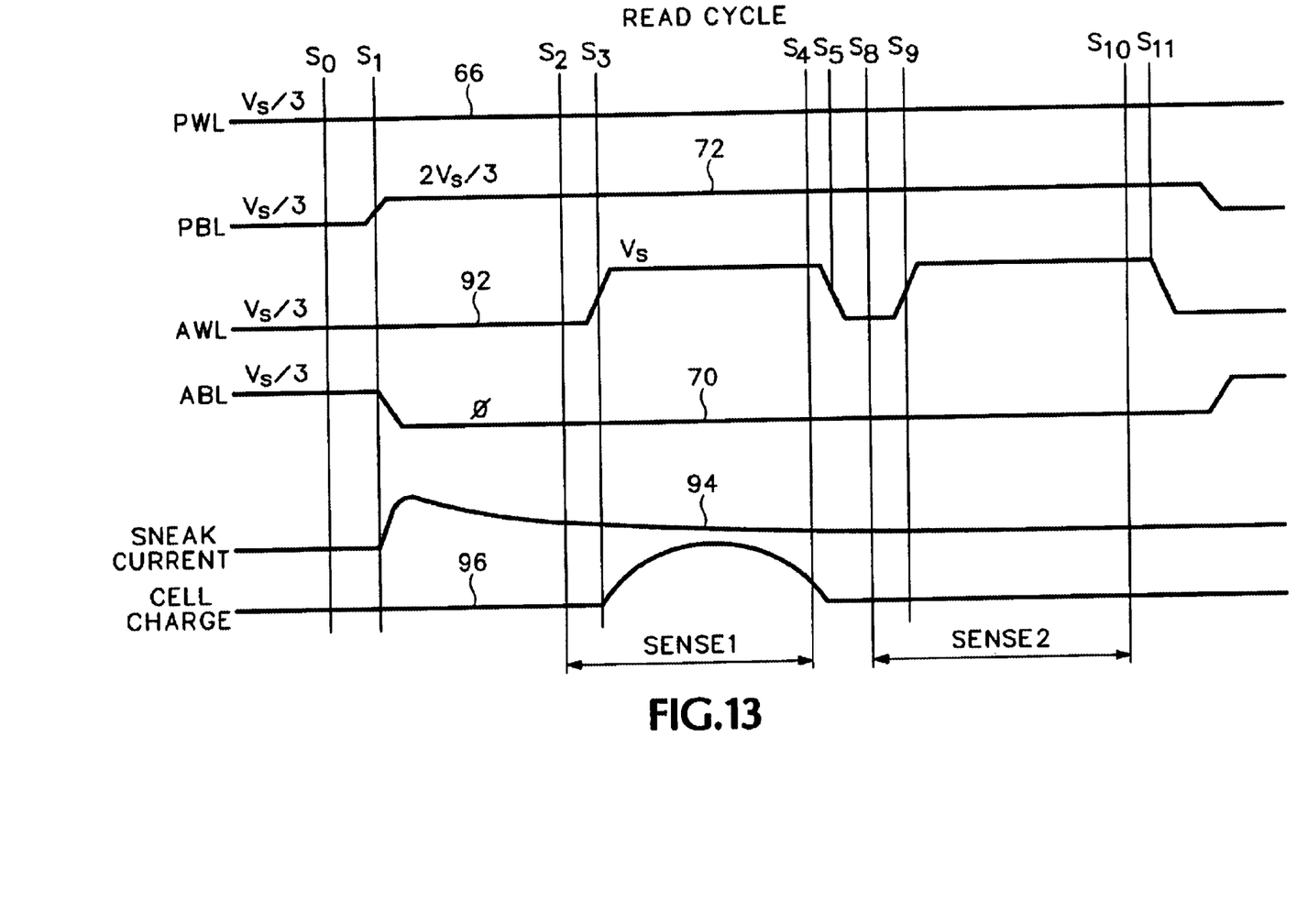
FIG. 13 is a timing diagram schematically illustrating a sequence of signals associated with reading a ferroelectric cell of a ferroelectric memory array in accordance with an exemplary embodiment of the present invention.

At time $S_0$, as shown in the timing diagram of FIG. 13, the wordlines and bitlines receive (block 98 of FIG. 14) quiescent level voltages of $V_s/3$. A sneak current 94 is then drawn 100 from the active bitline after charging the passive bitlines to voltage levels of $2V_s/3$ and discharging the active bitline to zero volts, as represented by waveforms 72,70 at snapshot time $S_1$ in FIG. 13. In accordance with an exemplary embodiment of the present invention, a bitline settling duration of several microseconds is provided before starting a first integration interval. This bitline settling duration is described for a particular exemplary embodiment for ferroelectric cells comprising a polymer material of given thickness; alternative embodiments can have different bitline settling durations. The durations would be set in accordance with the switching characteristics of the alternative ferroelectric material and a duration sufficient for sneak currents to reach their linear region.

In accordance with an exemplary embodiment of the present invention, the bitline settling is allowed a duration $\tau$ extending beyond a rapid transition region of the of the material's polarization settling characteristic, wherein the sneak current will have reached a substantially linear region of its characteristic settling curve.

Figure 14:
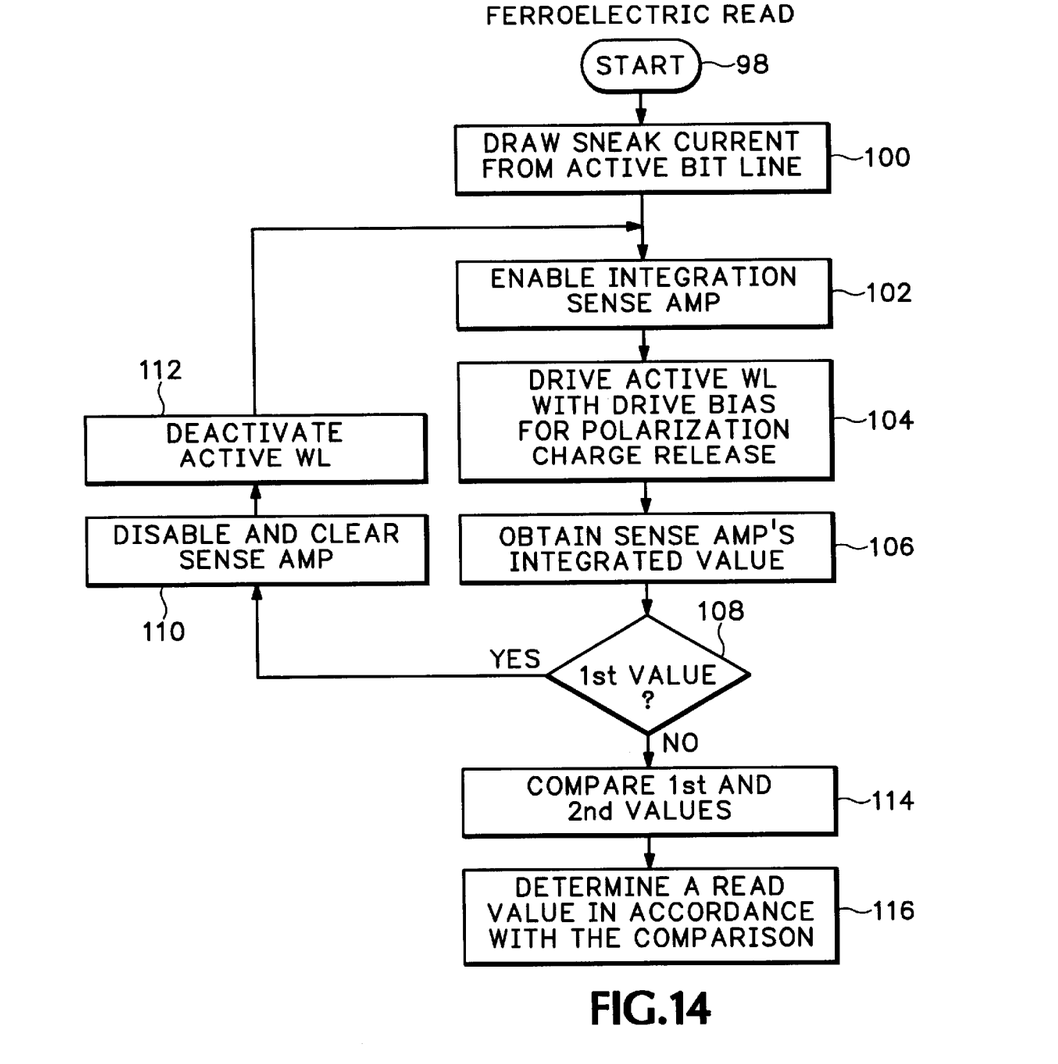
FIG. 14 is a flow chart schematically illustrating a method of reading a ferroelectric cell in accordance with an exemplary embodiment of the present invention.

After the bitline settling duration for the sneak current to reach a substantially linear region of its settling curve, the integration sense amplifier (e.g., 56 of FIGS. 5 and 8) is enabled 102 at snapshot time $S_2$, referencing FIGS. 13 and 14, to begin a first integration time window. The sense amplifier is turned on. Next, the active wordline is charged 104 to a read level voltage equal to the saturation level $V_s$ as represented by waveform 92 at time $S_3$. The integrating sense amplifier provides an integration for duration of several microseconds, to integrate charge released from the active ferroelectric cell. Upon conclusion $S_4$ of the first integration window, a first integration value is obtained 106 from the integration sense amplifier.

After obtaining the first integration value, the integration sense amplifier is disabled and the active wordline returned 112 to its quiescent voltage level of $V_s/3$, as represented by waveform 92 at snapshot time $S_5$. The active bitline remains at its bias voltage of 0V. This prevents disturbing the passive cells which produce the sneak currents. Alternatively, the active bitlines transitions to $V_s/3$ to provide 0V across the passive cells and stabilize the sneak currents for the second integration. After several microseconds for the active ferroelectric cell to stabilize its remanent polarization condition, the integrating sense amplifier is again enabled 102 to start the second integration window at time $S_8$, and the active wordline is driven 104 to a read level voltage equal to the saturation level voltage $V_s$, see waveform 92 at time $S_9$ in FIG. 13. Over this second integration duration, residual charge released from the ferroelectric cell is integrated by the integration sense amplifier.

At the conclusion of the second integration time window, at time $S_{10}$, a second integrated value is obtained 106 from the sense amplifier, and second integration value subtracted from the first. The resultant difference is compared 114 to a threshold value to determine 116 the initial state of the ferroelectric cell. Following the second integration time window, the active wordline is returned to its quiescent level voltage $V_s/3$ as represented by waveform 92 at time $S_{11}$, and the active and passive bitlines returned to their quiescent level voltages of $V_s/3$ as represented by waveforms 70, 72.

Figure 8:
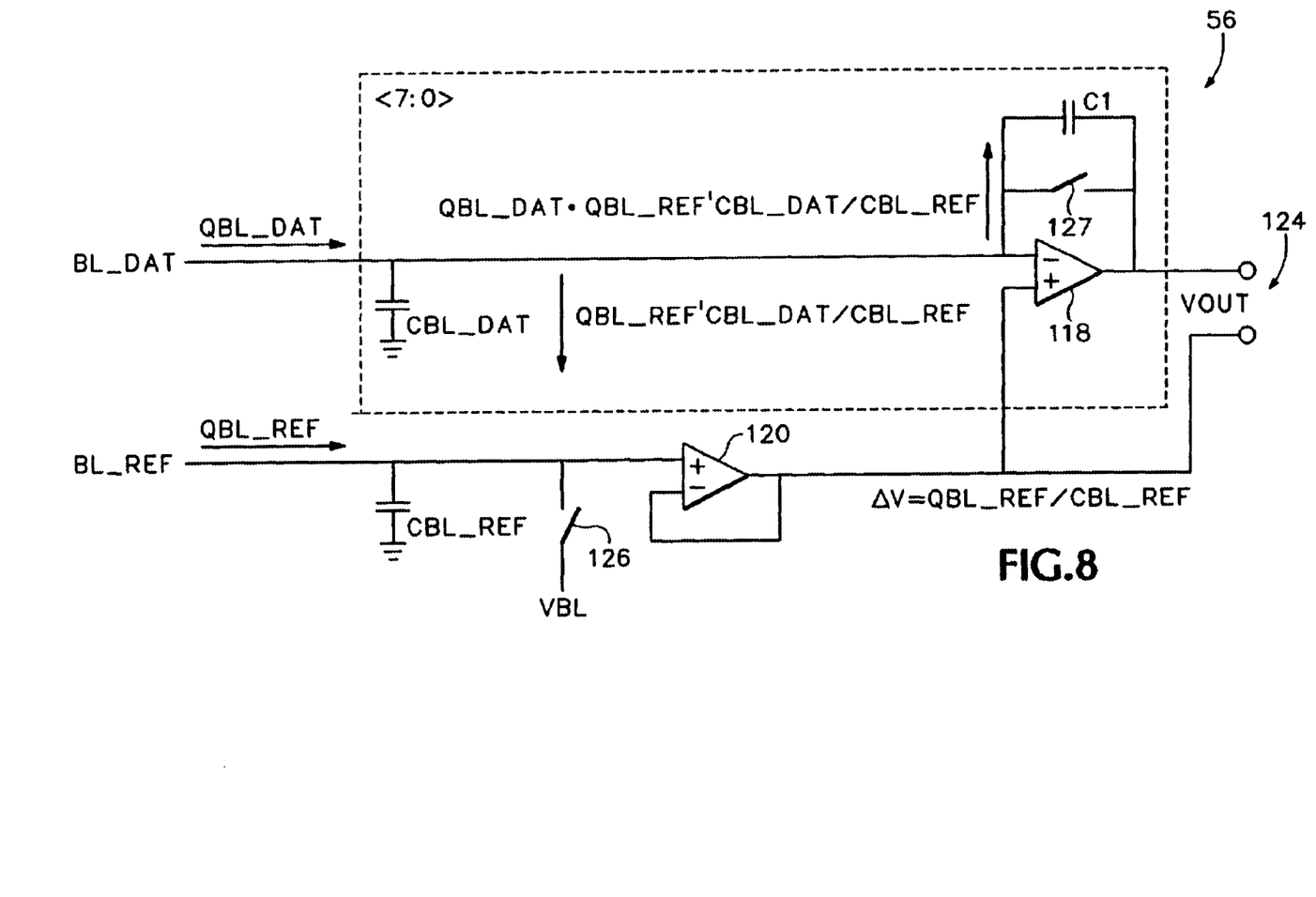
FIG. 8 is a simplified schematic diagram of a sense amplifier to sense an active bitline relative to a reference bitline associated with reading a ferroelectric cell in accordance with an exemplary embodiment of the present invention.

FIG. 8 shows an exemplary integrating sense amplifier to integrate charge of an active bitline in accordance with exemplary embodiments of the present invention. When switches 126 and 127 are open, integrating amplifier 118 integrates the difference in voltage between active bitline 22 relative to reference bitline 122 (FIG. 4). Buffer 120 buffers the voltage of the reference bitline for presentation to the positive terminal of the integrating amplifier 118, and as a reference level to the lower terminal of port 124.

In accordance with one embodiment, when the sense amplifiers operate to integrate charge released by the active ferroelectric cells, the ferroelectric memory device will isolate itself from external supplies. This can be accomplished by configuring pass gates serially into supply lines of the ferroelectric memory device, and disabling these pass gates during the operations of the sense amplifier. Supply capacitors of the memory device are coupled to the supply lines on the memory circuit sides of the pass gates, and are made sufficiently large in capacitance for storing energy to sustain continued operation of the ferroelectric memory device during the integration intervals of the sense amplifier. By decoupling the supplies of the ferroelectric memory device during the integration intervals, the sense amplifier can perform the sense operations with reduced risk of supply noise artifacts.

Continuing with reference to FIGS. 4, 5, 8 and 13, when the integration sense amplifier 56 is enabled before the activation of the wordline (referencing waveform 92 of FIG. 13), both the positive and negative input terminals of integration amplifier 118 receive substantially equivalent residual charge contributions per their respective stray capacitive coupling contributions from the active wordline 20 to active bitline 22 (FIG. 4), and from the active wordline 20 to reference bitline 122. Additionally, by providing fatigue properties and aging for the reference cells of the reference bitline that are similar to cells of the memory array, then the residual charges released by zero state polarization alignments of the active cells during activation of the active wordline will be similar to those released by the reference cells. Accordingly, the similar stray capacitive couplings and similar residual zero state polarization alignments will effect similar residual charge contributions to the active and reference bitlines, which similar charge contributions substantially cancel one another when acted upon by the differential integrating amplifier 118.

Figure 15A:
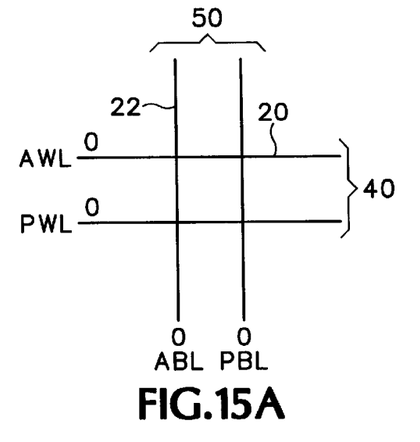
FIGS. 15A–15E schematically illustrate wordlines and bitlines of a ferroelectric memory array under different bias conditions associated with reading a ferroelectric memory in accordance with exemplary embodiments of the present invention.

In accordance with another exemplary embodiment of the present invention, a ferroelectric memory is driven through a sequence of bias conditions, as illustrated by FIGS. 15A–15E, to read data of an active cell between an active bitline and active wordline. Initially, as shown in FIG. 15A, all bitlines and wordlines begin with a low level bias of 0 volts. Again, it is noted that the low level bias 0 typically comprises a bitline offset bias of $V_{BL}$. All ferroelectric cells receive an electric field influence between plates of 0 volts.

Figure 15B:
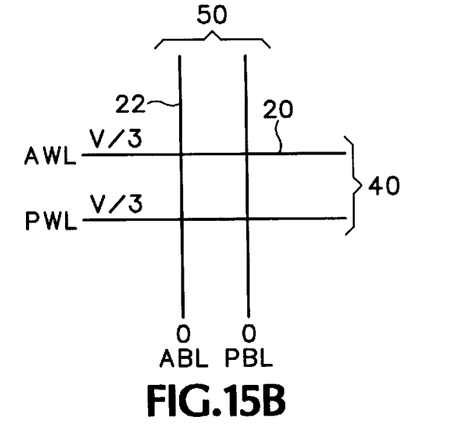

Next, the wordlines receive a first quiescent bias level of Vs/3 as shown in FIG. 15B. The cells of the array experience an electric field influence of +Vs/3 of the wordline electrodes relative to the bitline electrodes. As noted previously herein, the Vs/3 level is within the recovery range of the ferroelectric material's polarization characteristics. Additionally, with the +Vs/3 electric field influence, the bitlines will be drawing sneak currents from cells of the memory array.

Figure 15C:
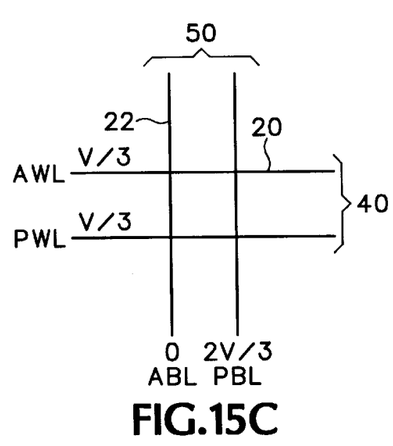

In FIG. 15C, the passive bitlines receive a second quiescent level bias of 2Vs/3. The active bitline maintain the low level bias 0V. The cells between the wordlines and the active bitline receive a bias influence of +Vs/3 while the cells between the wordlines and the passive bitline experience a −Vs/3 bias for the wordlines relative the passive bitline.

During a first integration time frame, as described earlier herein, the active wordline receives a high level bias of Vs. The cell between the active wordline and the active bitline experiences an electric field influence of +Vs. Cells between the passive wordlines to the active bitline receive the quiescent level +Vs/3, cells between the active wordline to the passive bitlines receive the quiescent level +Vs/3, and those between the passive wordlines and passive bitlines receive the quiescent level –Vs/3. Again, the sense amplifier is to be enabled before activating the active wordline with the Vs bias level. The integration amplifier accumulates charge released from the active cell and propagated by the active bitline.

After an integration period, a first integrated value is obtained from the integrating sense amplifier. The active wordline is returned to Vs/3 as shown by FIG. 15C and the accumulated value of the integrating sense amplifier cleared.

Figure 15D:
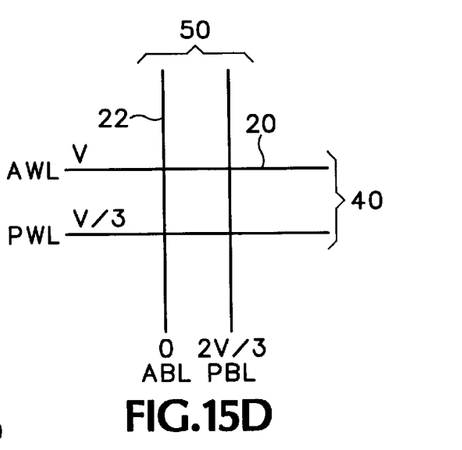

Initiating a second integration, the integrating sense amplifier is again enabled and the active wordline driven with Vs per the bias condition of FIG. 15D. The sense amplifier accumulates charged propagated by the active bitline during a second integrating duration. A second integrated value is then obtained and subtracted from the first integrated value. The resultant difference between the first and second integrated values is compared to a threshold to determine a data value.

After the second integrated value has been obtained, the bias levels of the wordlines and bitlines follow the sequence of bias conditions as represented from the respective conditions of FIGS. 15D to 15C to return the active wordline from Vs to Vs/3. Next, if no further reads are pending, the read sequence concludes via the conditions of FIG. 15B (passive wordlines from 2Vs/3 to 0) and FIG. 15A (wordlines from Vs/3 to 0).

Figure 15E:
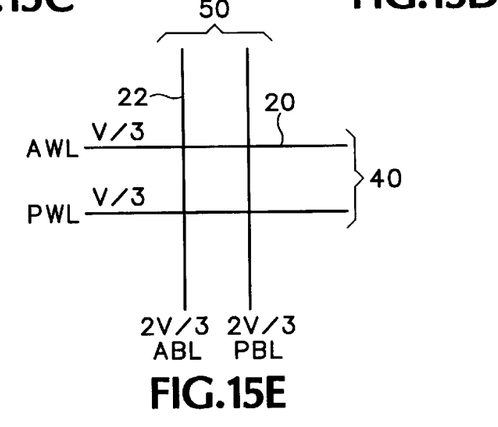

In accordance with an alternative exemplary embodiment, an intermediate bias state is established between a pluralities of read operations. Upon returning to the bias condition of FIG. 15C in which the active wordline has been restored to Vs/3, the active bitline transitions from the low level bias 0V to the second quiescent level bias 2Vs/3 as illustrated by FIG. 15E. From this intermediate condition, additional row and column addresses typically designate new bitlines and wordlines as the active lines for reading subsequent active cells of the array. In this fashion, the bias conditions sequence to those represented by FIGS. 15C and 15E as described earlier herein.

Finally, when no further reads are pending, the bias levels of the wordlines and bitlines are returned to their low bias levels 0V, via the sequence 15C to 15B passive wordlines from 2Vs/3 to 0), and finally from 15B to 15A (wordlines from Vs/3 to 0).

It will be apparent to those skilled in this art that the illustrated embodiments are exemplary and that various changes and modifications may be made thereto as become apparent upon reading the present disclosure. Accordingly, such changes and modifications are considered to fall within the scope of the appended claims.

What is claimed is:

1. A method of reading a ferroelectric cell of a ferroelectric memory array, comprising:
   biasing a second electrically conductive line relative a first electrically conductive line to apply a quiescent level voltage of a magnitude less than that required to switch a polarization state of a ferroelectric cell between the first and the second electrically conductive lines;
   beginning a first integration of charge propagated by the first electrically conductive line; and
   after beginning the first integration, driving the second electrically conductive line relative to the first electrically with a read level voltage of a magnitude sufficient to switch a polarization of the ferroelectric cell.

2. A method according to claim 1, further comprising:
   continuing the first integration to integrate charge released from the ferroelectric cell to the first electrically conductive line;
   obtaining a first integrated value related to the first integration;
   after obtaining the first integrated value, reducing the voltage of the second electrically conductive line relative to the first electrically conductive line; and
   after the reducing the voltage of the second electrically conductive line, beginning a second integration of charge propagated by the first electrically conductive line;
   after beginning the second integration, driving the second electrically conductive line with the read level voltage;
   obtaining a second integrated value related to the second integration;
   subtracting from the first integrated value the second integrated value to provide a difference value; and
   determining a data value based upon the difference.

3. A method according to claim 2, wherein the determining compares the difference value to a threshold value.

4. A method according to claim 2, wherein the first electrically conductive line is coupled to a plurality of ferroelectric cells, the method further comprising drawing a sneak current from the plurality before the beginning the first integration.

5. A method of reading according to claim 2, the driving the second electrically conductive line with the read level voltage further comprises applying the read level voltage to a reference cell disposed between the second electrically conductive line and a reference electrically conductive line; and
   each of the first and the second integrations comprises integrating the difference in charge propagated by the first electrically conductive line relative to charge propagated by the reference electrically conductive line.

6. A method of reading a stored state of a ferroelectric cell comprising:
   drawing sneak current from a bit line coupled to a plurality of ferroelectric cells;
   driving a ferroelectric cell of the plurality with an electric field sufficient to enable a polarization reversal of the ferroelectric cell and a charge release to the bit line; and
   integrating charge propagated by the bit line during the driving to obtain a first integration value; and
   beginning the integrating before the start of the driving.

7. A method according to claim 6, wherein the driving comprises biasing a wordline that is coupled to the ferroelectric cell with a read level voltage of a magnitude for setting a polarization of the ferroelectric cell, the method further comprising:
   after the integrating and the driving, biasing the wordline with a quiescent level voltage of a magnitude less that that required to switch a remanent polarization of the ferroelectric cell;
   after providing the wordline the quiescent level voltage, starting a second integration of charge propagated on the bit line to obtain a second integration value;

driving the wordline with the read level voltage during the second integration;

comparing the first and the second integration values; and determining a stored value of the ferroelectric cell based upon the comparing.

8. A method according to claim 6, further comprising:

after obtaining the first integration value, discontinuing the driving of the ferroelectric cell to relax polarization domains of the ferroelectric material of the ferroelectric cell;

after the relaxing, repeating the driving and the integrating to obtain a second integration value;

beginning the second integration before the start of the second driving;

subtracting the second integration value from the first integration value to provide a difference value; and comparing the difference value to a threshold value to determine a data value.

9. A method according to claim 6, wherein the drawing sneak currents from the plurality of ferroelectric cells comprises providing a quiescent level electric field across the plurality of ferroelectric cells, the quiescent level of a magnitude less than about one third the field strength required for a polarization reversal.

10. A method according to claim 9, wherein the drawing sneak currents from the plurality of ferroelectric cells is performed before the starting the integrating and over a duration of at least three characteristic time constants as associated with characterizing a polarization settling profile of the ferroelectric cells.

11. A method according to claim 9, wherein the drawing sneak currents from the plurality of ferroelectric cells is performed for a duration of several microseconds before the starting the integrating.

12. A method according to claim 6, further comprising:

providing a reference bit line coupled to a plurality of reference ferroelectric cells;

driving a reference ferroelectric cell coupled to a reference bit line substantially the same as, and concurrent with, the driving of the ferroelectric cell; and the integrating comprises integrating the difference in charge propagated to the bit line relative to charge propagated to the reference bit line.

13. A method of reading a ferroelectric cell of a ferroelectric memory array, comprising:

drawing a sneak current from an active bitline of the plurality of bitlines;

driving an active wordline of a plurality of wordlines with a first switching level pulse, the switching level defined relative to the active bitline and of a magnitude sufficient to switch a polarization state of an active ferroelectric cell between the active wordline and the active bitline; and integrating current on the active bitline to obtain a first integration value;

beginning the integrating after the drawing sneak current from the active bitline and before the driving the active wordline with the switching level pulse; and continuing the integration for a duration to integrate charge released by the active ferroelectric cell during the driving.

14. A method according to claim 13, further comprising:

after driving the active wordline with the first switching level pulse, biasing the active wordline with a quiescent level voltage, the quiescent level defined relative to the active bitline and of a magnitude less than $\frac{1}{3}$ that required to switch a polarization state of the active ferroelectric cell;

continuing the biasing of the active wordline with the quiescent level voltage for a relaxation duration, the relaxation duration to allow settling of the polarization alignments of at least some domains of the active ferroelectric cell;

after the relaxation duration, integrating current on the active bitline as a second integration;

after starting the second integration, driving the active wordline with a switching level pulse;

obtaining a second integration value from the second integration; and comparing the first integration value to the second integration value.

15. A method according to claim 13, wherein the drawing a sneak current comprises biasing the plurality of wordlines to a first voltage level, and biasing the active bitline to a second voltage level different from the first voltage level, the difference between the first and second voltage levels being less than $\frac{1}{3}$ that required for polarization switching.

16. A method according to claim 15, wherein the ferroelectric cells coupled to the active bitline comprise a characteristic polarization response curve modeled by a rapid transition region through duration $\tau$ followed by a substantially linear region as associated with the settling of their polarization states, the drawing the sneak current continues for a duration of at least $\tau$ before beginning the integrating.

17. A method according to claim 13, further comprising:

driving a reference bitline associated with a plurality of reference cells substantially the same as the active bitline;

the integrating comprises integrating a difference in charge propagated to the active bitline relative to a charge propagated to the reference bitline.

* * * * *